(12) United States Patent
Hu

(10) Patent No.: US 7,642,814 B2
(45) Date of Patent: Jan. 5, 2010

(54) LEAKAGE COMPENSATION CIRCUIT USING LIMITING CURRENT INVERTER

(75) Inventor: Yaqi Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/567,511

(22) Filed: Dec. 6, 2006

(65) Prior Publication Data
US 2008/0136492 A1 Jun. 12, 2008

(51) Int. Cl.
G05F 1/10 (2006.01)
G05F 3/02 (2006.01)
(52) U.S. Cl. ...................................................... 327/44
(58) Field of Classification Search ................... 327/544
See application file for complete search history.

(56) References Cited

U.S. PATENT DOCUMENTS 5,493,246 A * 2/1996 Anderson .................... 327/382
7,030,688 B2 * 4/2006 Dosho et al. ................ 327/558
7,132,865 B1 * 11/2006 Terrovitis et al. ............ 327/157
7,250,808 B2 * 7/2007 Yoshimura ................... 327/536
2005/0077955 A1 * 4/2005 Dosho et al. ................ 327/558
2005/0275446 A1 * 12/2005 Hairston ..................... 327/336

FOREIGN PATENT DOCUMENTS

JP 2002185268 A * 6/2002

* cited by examiner

Primary Examiner—Lincoln Donovan
Assistant Examiner—Adam D Houston
(74) Attorney, Agent, or Firm—Dawn V. Stephens; Wade James Brady, III; Frederick J. Telecky, Jr.

(57) ABSTRACT

The leakage compensation circuit includes: a replica circuit of a circuit to be compensated, the replica circuit provides a replica leakage current equal to a leakage current of the circuit to be compensated; an amplifier having a first input coupled to the replica circuit and a second input coupled to a node to be compensated; a first resistance coupled between an output of the amplifier and the replica circuit; a second resistance coupled between the output of the amplifier and the node to be compensated; and wherein the replica leakage current is subtracted from the node to be compensated.

13 Claims, 1 Drawing Sheet

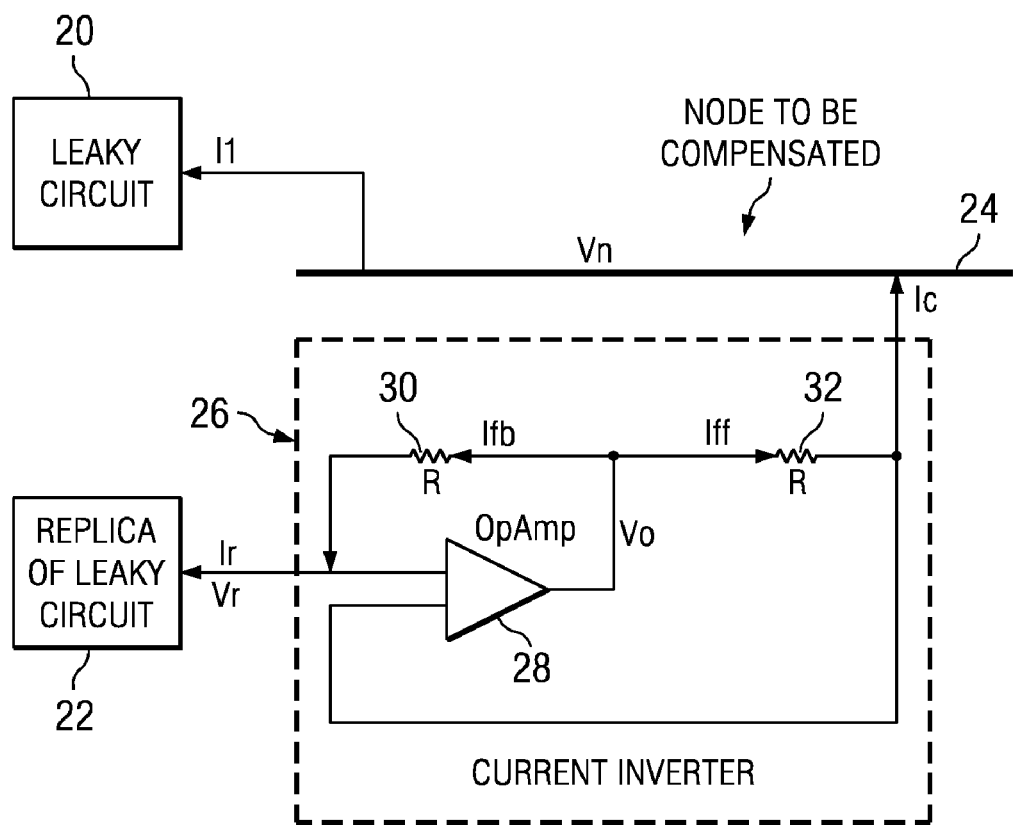

LEAKAGE COMPENSATION CIRCUIT USING LIMITING CURRENT INVERTER

FIELD OF THE INVENTION

The present invention relates to electronic circuitry and, in particular, to a leakage compensation circuit using limiting current inverter.

BACKGROUND OF THE INVENTION

The typical prior art leakage compensation circuit uses a current mirror to compensate the leakage current in the compensated circuit. One problem with this prior art approach is inaccurate compensation due to process mismatches. Another problem is that the current mirror can introduce its own leakage current if a large device size is used, for example, to reduce process mismatches.

SUMMARY OF THE INVENTION

A leakage compensation circuit includes: a replica circuit of a circuit to be compensated, the replica circuit provides a replica leakage current equal to a leakage current of the circuit to be compensated; an amplifier having a first input coupled to the replica circuit and a second input coupled to a node to be compensated; a first resistance coupled between an output of the amplifier and the replica circuit; a second resistance coupled between the output of the amplifier and the node to be compensated; and wherein the replica leakage current is subtracted from the node to be compensated.

BRIEF DESCRIPTION OF THE DRAWING

The drawing is a circuit diagram of a preferred embodiment leakage compensation circuit using a limiting current inverter.

DETAILED DESCRIPTION OF PREFERRED EMBODIMENTS

The preferred embodiment circuit shown in the Drawing includes: leaky circuit 20; replica of leaky circuit 22; compensated node 24; current inverter 26 which includes operational amplifier 28 and resistors 30 and 32; leakage current $I1$; replica leakage current $Ir$; replica voltage $Vr$; compensation current $Ic$; and compensation node voltage $Vn$. This circuit compensates the leakage current $I1$ by injecting a compensation current $Ic$ which is equal in magnitude but opposite in polarity to a replica current $Ir$. The compensation current $Ic$ is generated by applying a voltage through a highly resistive device.

Because of the high gain of the operational amplifier 28, the voltage $Vr$ on the output pin of the replica 22 will be forced to equal voltage $Vn$ on the node to be compensated 24. This ensures that current $Ir$ from replica 22 which depends on the output voltage, equals the leakage current $I1$ from leaky circuit 20.

Since
$Ifb=(Vo-Vr)/R$,
$Iff=(Vo-Vn)/R$,
Therefore
$Ifb=Iff$.
Because of the high input impendence of the operational amplifier,
$Ir=Ifb$,
$Ic=Iff$,
Therefore
$Ic=Ir$.

As such, the net current on the node 24 is $Ic-I1=0$. Therefore, the leakage current $I1$ from the leaky circuit 20 is compensated. Currents $Ifb$, $Iff$, $Ir$, and $Ic$ are currents shown in the Drawing. Voltages $Vo$, $Vr$, and $Vn$ are voltages shown in the Drawing.

Since the mismatch between compensation current $Ic$ and replica current $Ir$ has linear relationship to the voltage offset at the input of the op amp 28, versus the exponential relationship with current mirrors, this leakage compensation circuit is more tolerant to process mismatches. Also, since the maximum current injected by the leakage compensation circuit is limited to $Vdd/R$ (where $Vdd$ is a source voltage) and $R$ is a very high resistance, the leakage compensation circuit will not inject very large current to the node to be compensated, even if the circuit does not function correctly. This is in contrast to current mirror based compensation circuits which could inject very high current.

The large resistance $R$ for resistors 30 and 32 can be provided by transistors working in the cut-off region. This reduces the size of the leakage compensation circuit. Also, since the resistance of the transistors is inversely proportional to their leakage current, it provides some tracking to the transistors in the leaky circuit 20 across process and temperature.

The preferred embodiment circuit reduces undesirable effects of leakage current in phase-locked loops, such as spurious jitter and static phase offset. It can also reduce unwanted effects of leakage current in other circuits.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A leakage compensation circuit comprising:
   a replica circuit of a circuit to be compensated, the replica circuit provides a replica leakage current equal to a leakage current of the circuit to be compensated;
   an amplifier having a first input coupled to the replica circuit and a second input coupled to a node to be compensated;
   a first resistance coupled between an output of the amplifier and the replica circuit;
   a second resistance coupled between the output of the amplifier and the node to be compensated; and
   wherein the replica leakage current is subtracted from the node to be compensated and the leakage compensation circuit compensates for the leakage current without using a current mirror.

2. The circuit of claim 1 wherein the first input of the amplifier is a negative input and the second input is a positive input.

3. The circuit of claim 1 wherein the first resistance is equal to the second resistance.

4. A circuit having leakage current compensation comprising:
   a leaky circuit;
   a replica circuit of the leaky circuit, the replica circuit provides a replica leakage current equal to a leakage current of the leaky circuit;
   an amplifier having a first input coupled to the replica circuit and a second input coupled to a current leakage node of the leaky circuit; a first resistance coupled between an output of the amplifier and the replica circuit; a second resistance coupled between the output of the amplifier and the current leakage node; and wherein the replica leakage current cancels the leakage current of the leaky circuit and the circuit compensates for the leakage current without using a current mirror.

5. The circuit of claim 4 wherein the first input of the amplifier is a negative input and the second input is a positive input.

6. The circuit of claim 4 wherein the first resistance is equal to the second resistance.

7. A circuit having leakage current compensation comprising:
   a compensation node for receiving a current from a leaky circuit;
   a current inverter having an input and an output, the output coupled to the compensation node;
   a replica of the leaky circuit having an output coupled to the input of the current inverter and operative for producing a compensation current equal to the current from the leaky circuit,
   wherein the current inverter is operative for producing a current on the output with a polarity that is opposite than a polarity received at its input but equal in magnitude, and
   the current inverter comprising an amplifier and at least a first resistor and a second resistor.

8. The circuit of claim 7 wherein the amplifier is a high-gain, operational amplifier and there is a linear relationship between an offset voltage and difference between the compensation and the current from the leaky circuit.

9. The circuit of claim 7 wherein the resistances associated with the two resistors are equal and very high.

10. The circuit of claim 9 wherein the resistors comprise transistors operating in a cutoff region.

11. The circuit of claim 7 wherein the amplifier has a first input coupled to the input of the current inverter and the amplifier has a second input coupled to the compensation node.

12. The circuit of claim 7 wherein the amplifier has an output, and the first resistor is coupled between the first input of the amplifier and the output of the amplifier.

13. The circuit of claim 12 wherein the amplifier has an output, and the second resistor is coupled between the compensation node and the output of the amplifier.

* * * * *